(12) United States Patent
Benson

(10) Patent No.: US 7,843,268 B2
(45) Date of Patent: Nov. 30, 2010

(54) MODIFIED DISTRIBUTED AMPLIFIER TO IMPROVE LOW FREQUENCY EFFICIENCY AND NOISE FIGURE

(75) Inventor: Keith Benson, Cambridge, MA (US)

(73) Assignee: Hittite Microwave Corporation, Chelmsford, MA (US)

( * ) Notice: Subject to any disclaimer, the term of this patent is extended or adjusted under 35 U.S.C. 154(b) by 285 days.

(21) Appl. No.: 12/148,203

(22) Filed: Apr. 17, 2008

(65) Prior Publication Data

US 2010/0019851 A1 Jan. 28, 2010

(51) Int. Cl.
*H03F 3/60* (2006.01)
(52) U.S. Cl. ...................................... 330/286
(58) Field of Classification Search ............... 330/54, 330/286, 295
See application file for complete search history.

(56) References Cited

U.S. PATENT DOCUMENTS

| | | | |
|---|---|---|---|
| 5,361,038 A | 11/1994 | Allen et al. | |
| 5,365,197 A | 11/1994 | Ikalainen | |
| 6,049,250 A | 4/2000 | Kintis et al. | |
| 6,342,815 B1 * | 1/2002 | Kobayashi | 330/286 |
| 6,472,941 B2 * | 10/2002 | Shigematsu | 330/286 |
| 6,597,243 B1 | 7/2003 | Fratti | |
| 6,674,329 B1 | 1/2004 | Stengel et al. | |
| 6,737,921 B2 | 5/2004 | Nakano | |
| 6,768,380 B2 | 7/2004 | Hong et al. | |
| 6,778,015 B2 | 8/2004 | Ogawa | |
| 6,864,750 B2 | 3/2005 | Shigematsu | |
| 2002/0130720 A1 | 9/2002 | Pavio et al. | |

OTHER PUBLICATIONS

Lee, Thomas, *The Design of CMOS Radio-Frequency Integrated Circuits*, Section 9.7.5, The Distributed Amplifier, Edition 2004, pp. 304-306.
Ayasli et al. *A Monolithic GaAs 1-13 GHz Traveling-Wave Amplifier*, IEEE Transactions on Microwave Theory and Techniques, vol. MTT-30, No. 7, Jul. 1982, pp. 976-981.
Beyer et al., *Mesfet Distributed Amplifier Design Guidelines*, IEEE Transactions on Microwave Theory and Techniques, vol. MTT-32, No. 3, Mar. 1984, pp. 268-275.
Beyer, et al., "MESFET Distributed Amplifier Design Guidelines", IEEE Trans. On Microwave Theory and Techniques, vol. MTT-32, No. 3, Mar. 1984, pp. 268-275.
Cascaded Amplifiers, Chapter 9.7, pp. 304-306. (Author unknown.) 2004.
Ayasli et al., "A Monolithic GaAs 1-13-GHz Traveling-Wave Amplifier", IEEEE Trans. On Microwave Theory and Techniques, vol. MTT-30, No. 7, Jul. 1982, pp. 976-981.

* cited by examiner

*Primary Examiner*—Robert Pascal
*Assistant Examiner*—Khiem D Nguyen
(74) *Attorney, Agent, or Firm*—Iandiorio Teska & Coleman

(57) ABSTRACT

A distributed amplifier system has a predetermined output impedance and input impedance and includes an input transmission circuit; an output transmission circuit; at least two amplifiers connected between the input and output transmission circuits; an input termination on the input transmission circuit; and a feedback output termination on the output transmission circuit connected back to the input transmission circuit for reducing low frequency loss while maintaining the predetermined output impedance and input impedance.

15 Claims, 5 Drawing Sheets

US 7,843,268 B2

MODIFIED DISTRIBUTED AMPLIFIER TO IMPROVE LOW FREQUENCY EFFICIENCY AND NOISE FIGURE

RELATED APPLICATIONS

This invention was made with U.S. Government support under Contract No. W15P7T-06-C-P218 by the U.S. Army. The Government has certain rights in the subject invention.

FIELD OF THE INVENTION

This invention relates to an improved distributed amplifier system with improved low frequency efficiency and noise figure.

BACKGROUND OF THE INVENTION

A traditional distributed amplifier system is a proven way to build a wideband amplifier. Typical bandwidths of distributed amplifiers on a GaAs substrate could be on the order of 10 kHz-10 GHz. A cascode distributed amplifier is widely recognized as a way to improve gain and bandwidth over a non-cascode distributed amplifier. The benefit of a distributed amplifier system is accomplished by incorporating the parasitic effects of the transistor into the matching networks between amplifiers (slices). The input and output capacitances of the system can be combined with the gate line (input transmission circuit) and drain line (output transmission circuit) inductance, respectively, to make the transmission lines virtually transparent, excluding transmission line loss. By doing this, the gain of the amplifier system should only be limited by the transconductance and not the parasitics. This only happens if the signal traveling down the gate line (input transmission circuit) is in phase with the signal traveling down the drain line (output transmission circuit), so that each amplifier's (slice's) output voltage adds in phase with the previous amplifier's (slice's) output. The signal traveling to the output will constructively interfere so that the signal grows along the drain line (output transmission circuit). Any reverse waves will destructively interfere since these signals will not be in phase. The gate line (input transmission circuit) termination is included to absorb any signals that are not coupled to the gates of the amplifier transistors. The drain line (output transmission circuit) termination is included to absorb any reverse traveling waves that could destructively interfere with the output signal. The traditional distributed amplifier system suffers from poor efficiency as many of the amplifiers in the chain are not optimally matched for power. Efficiency's on the order of 15% are typical in the GHz range. Typically, plots of P1dB and PAE (Power Added Efficiency) are only shown in the GHz range when describing these parts. However, when designing a part that has to operate from MHz to GHz what happens below the GHz range becomes important. The traditional distributed amplifier system will show power output compression by 1 dB relative to a linear input increase in input power (P1dB) and power added efficiency (PAE) will suffer. In the traditional distributed amplifier, the signal in the MHz range will flow equally to the drain line (output transmission circuit) termination and the RF output load. Therefore, at most only half of the usable power is delivered to the output and the other half will be dissipated in the output transmission circuit termination. In the GHz range, the signal traveling to the output will constructively interfere and grow while any reverse waves will destructively interfere and decrease so that very little power is absorbed into the output transmission circuit termination. For this reason, the output transmission circuit termination is of little impact on output power at higher frequencies but has a very large impact at lower frequencies. Ideally, at low frequencies, the drain line should not include any extra loading than the RF output, typically 50 ohms. If output transmission circuit termination is simply removed, the output match becomes unusable (~2 dB). In addition, the gain shows a spike at low frequencies. For more see: THE DESIGN OF CMOS RADIO-FREQUENCY INTEGRATED CIRCUITS Section 9.7.5 THE DISTRIBUTED AMPLIFIER, by Thomas Lee, $2^{nd}$ Edition 2004, A MONOLITHIC GaAs 1-13 GHz TRAVELING-WAVE AMPLIFIER, by Yalcin Ayasli et al. IEEE Transactions on Microwave Theory and Technique, Vol. MTT-30, No. 7, July 1982, pages 976-981; and MESFET DISTRIBUTED AMPLIFIER DESIGN GUIDELINES by James B. Beyer et al., IEEE Transactions on Microwave Theory and Techniques, Vol. MTT-32, No. 3, March 1984, pages 268-275 all hereby incorporated in their entirety by this reference.

SUMMARY OF THE INVENTION

It is therefore an object of this invention to provide an improved distributed amplifier system.

It is a further object of this invention to provide such an improved distributed amplifier system with improved low frequency efficiency.

It is a further object of this invention to provide such an improved distributed amplifier system with improved low frequency noise figure.

It is a further object of this invention to provide such an improved distributed amplifier system which maintains predetermined impedance of the system while improving low frequency efficiency and noise figure.

It is a further object of this invention to provide such an improved distributed amplifier system which provides better performance over an extended bandwidth on a single chip.

The invention results from the realization that an improved distributed amplifier system with improved low frequency efficiency and noise figure can be achieved by feedback-connecting the output termination to the input transmission circuit thereby allowing the output termination resistance to be increased causing the input signal to prefer propagation along the output transmission circuit relative to output termination resulting in better low frequency efficiency, while the feedback connection to the input transmission circuit results in the output impedance remaining at a predetermined level and further allowing an increase in the input termination resistance to reduce noise figure while maintaining the input impedance at a predetermined level.

The subject invention, however, in other embodiments, need not achieve all these objectives and the claims hereof should not be limited to structures or methods capable of achieving these objectives.

This invention features a distributed amplifier system having a predetermined input and output impedance including: an input transmission circuit; an output transmission circuit; and at least two amplifiers connected between the input and output transmission circuits. There is an input termination on the input transmission circuit and a feedback output termination on the output transmission circuit connected back to the input transmission circuit for reducing low frequency loss while maintaining the predetermined output impedance and input impedance.

In a preferred embodiment the plurality of amplifiers may include two amplifiers. The amplifiers may include cascode amplifiers. The input termination may include an input resistance and an input capacitance connected in series to ground.

The output termination may include an output resistance and an output capacitance connected in series. The output resistance may be substantially larger than the predetermined output impedance. The input resistance may be at least twice the predetermined output impedance. The output resistance may be in the range of two to twenty times the predetermined output impedance. The input resistance may be substantially larger than the predetermined input impedance for reducing the overall noise figure of the amplifier system. The feedback output termination may be fed back to the input of the input transmission circuit. There may be more than one feedback output termination connection between the output transmission circuit and the input transmission circuit.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
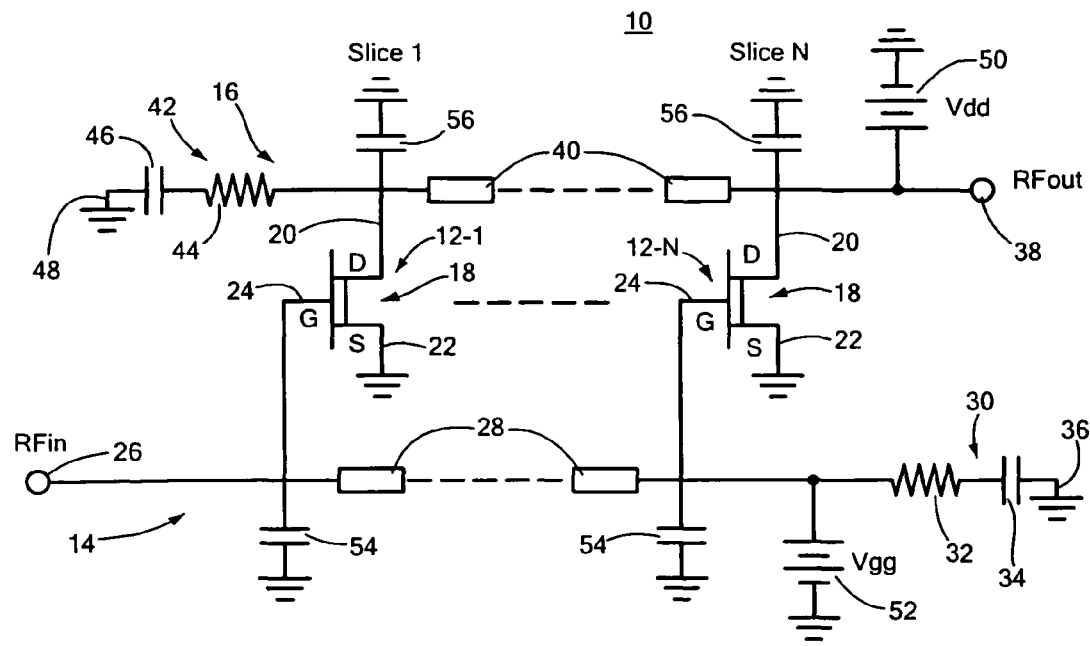
FIG. 1 is a schematic diagram of a prior art distribution amplifier system.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a prior art distributed amplifier system 10 including a plurality of at least two slices or amplifiers 12-1 through 12-N each of which is interconnected between an input transmission circuit 14 and an output transmission circuit 16. Each slice or amplifier 12-1 through 12-N includes a field effect transistor (FET) 18 having a drain 20 source 22 and gate 24. Each drain 20 is connected to output transmission circuit 16 while each gate 24 is connected to input transmission circuit 14. Each source 22 is connected to ground. Input transmission circuit 14 includes an input 26, transmission lines 28 and an input termination 30 including a resistance 32 and capacitance 34 connected in series to ground 36. Output transmission circuit 16 includes output 38, transmission lines 40 and output termination 42 which includes resistance 44 and capacitance 46 connected in series to ground 48. Vdd power supply 50 is typically +5 volts, while Vgg power supply 52 may be −1 volt operating at a range of 1 MHz to 10 GHz with a system impedance of 50 Ωs. Resistances 32 and 44 would typically be 50 Ωs and capacitances 34 and 46 might consist of three capacitors a 10 pf, a 100 pf and a 0.01 µf capacitor. Associated with each slice or amplifier 12-1 through 12-N are parasitic capacitances, such as capacitance 54 of approximately 0.3 pf and capacitance 56 of approximately 0.1 pf. One of the benefits of a traditional distributed amplifier system 10 is that the transmission line impedances 40 and 28 can be made to balance with the parasitic capacitances 54 and 56 to effectively become transparent. Distribution amplifier system 10 operates in a traditional way with the input at 26 moving through input transmission circuit 14 to the various amplifiers or slices 12-1 through 12-N to the output transmission circuit 16 where they are summed. One problem is that in the MHz range the signal flow will be equal to the output termination 42 and the output 38, therefore at most only half of the usable power is delivered to the output and the other half will be dissipated in the output transmission circuit termination 42. For more on the operation of distributed amplifier systems see THE DESIGN OF CMOS RADIO-FREQUENCY INTEGRATED CIRCUITS Section 9.7.5 THE DISTRIBUTED AMPLIFIER, by Thomas Lee, $2^{nd}$ Edition 2004, A MONOLITHIC GaAs 1-13 GHz TRAVELING-WAVE AMPLIFIER, by Yalcin Ayasli et al. IEEE Transactions on Microwave Theory and Technique, Vol. MTT-30, No. 7, July 1982, pages 976-981; and MESFET DISTRIBUTED AMPLIFIER DESIGN GUIDELINES by James B. Beyer et al., IEEE Transactions on Microwave Theory and Techniques, Vol. MTT-32, No. 3, March 1984, pages 268-275 all hereby incorporated in their entirety by this reference.

Figure 2:
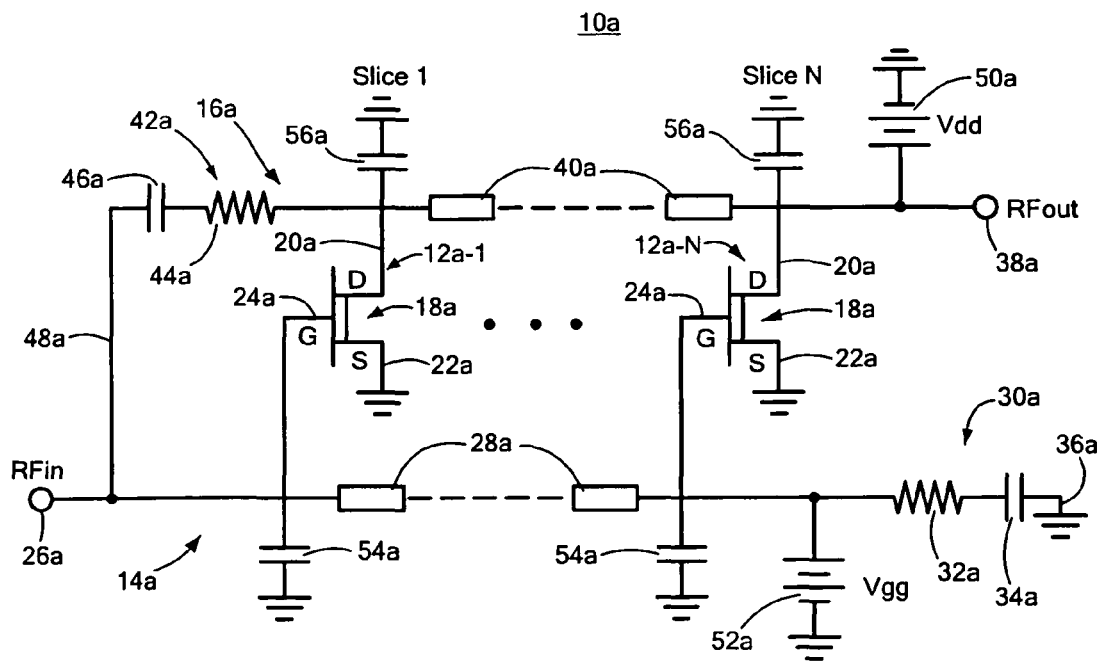
FIG. 2 is a schematic diagram of a distributed amplifier system having a plurality of at least two amplifiers/slices with the output termination connected to the input of the input transmission circuit according to this invention.

In accordance with this invention, FIG. 2, distributed amplifier system 10a includes output termination 42a connected not to ground, but rather as shown at 48a, in a feedback loop back to input transmission circuit 14a. If this is done with a large resistance/capacitance combination the desired results of flat gain, good output return loss and improved power and efficiency are achievable. The capacitance 46a blocks the DC bias applied to the drain of the FET transistors 18a. With resistance 44a large e.g. 2 to 20 times greater than the desired predetermined 50Ω output load impedance, most of the power is directed to the output rather than through output termination 42a. A typical value for the capacitance 46a is the same as discussed with respect to FIG. 1, that is 10 pf, 100 pf, and 0.01 µf. Resistance 44a, however, now typically can range from approximately 100 Ωs to 10,000 Ωs. This results in better low frequency efficiency and the feedback makes the output impedance remain approximately at the desired predetermined impedance such as an output impedance of 50 Ωs. This also allows the resistance 32a in input termination 30a to be made larger to reduce the low frequency noise figure while still maintaining a desired predetermined input impedance for example 50 Ωs. Resistance 32a in this case may be in a range of 50 Ωs to 10,000 Ωs and capacitance 34a again could be three capacitors 10 pf, 100 pf, and 0.01 µF. With the improved efficiency and noise figure obtained with this invention a much broader band of frequencies (e.g. 1 MHz to 10 GHz) can be served by distributed amplifier system 10a disposed on a single GaAs chip rather than having two or more separate circuits on separate chips to deal with different portions of the extended band. As input transmission circuit 14a is referred to as the gate line, input termination 30a may often be referred to as the gate termination. Likewise as output transmission circuit 16a is often referred to as the drain line, output termination 42a may be referred to as the drain termination.

Figure 3:
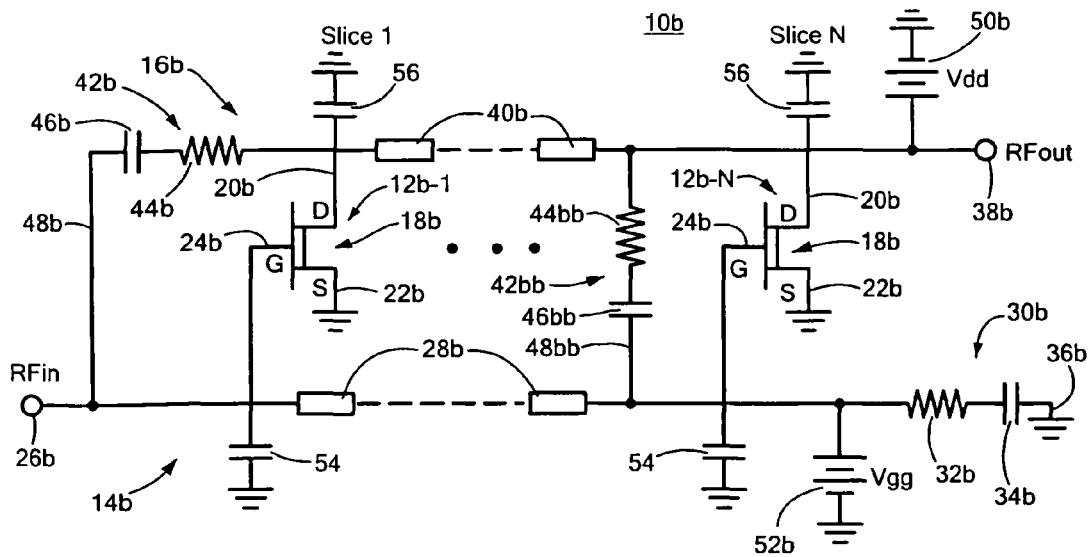
FIG. 3 is a view similar to FIG. 2 illustrating that the feedback output termination can be employed other than to the input of the input transmission circuit and that there can be more than one feedback output termination employed.

Although thus far the output termination 42a is shown singly and the feedback circuit is between the output termination circuit 16a and the input 26a of input transmission circuit 14a, neither is a necessary limitation of the invention. For example, as shown in FIG. 3, distributed amplifier system 10b may have an output termination circuit 42bb connected at any point between output transmission circuit 16b and input transmission circuit 14b. And there may be more than one such termination circuit 42b, 42bb-42bn.

Figure 4:
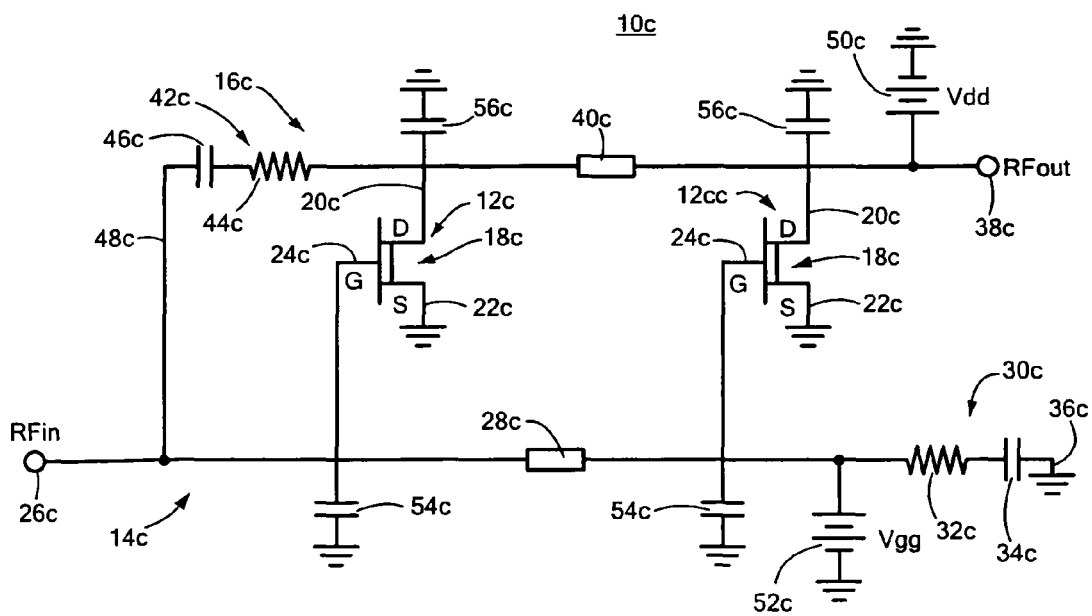
FIG. 4 is a view similar to FIG. 2 with the number of amplifier being two.

Although the distributed amplifier system of this invention has been shown in FIGS. 2 and 3 as including a plurality of more than two slices or amplifiers 12a-1 through 12a-N, the invention also contemplates a simpler version having a plurality of only two slices or amplifiers 12c, 12cc, FIG. 4.

Figure 5:
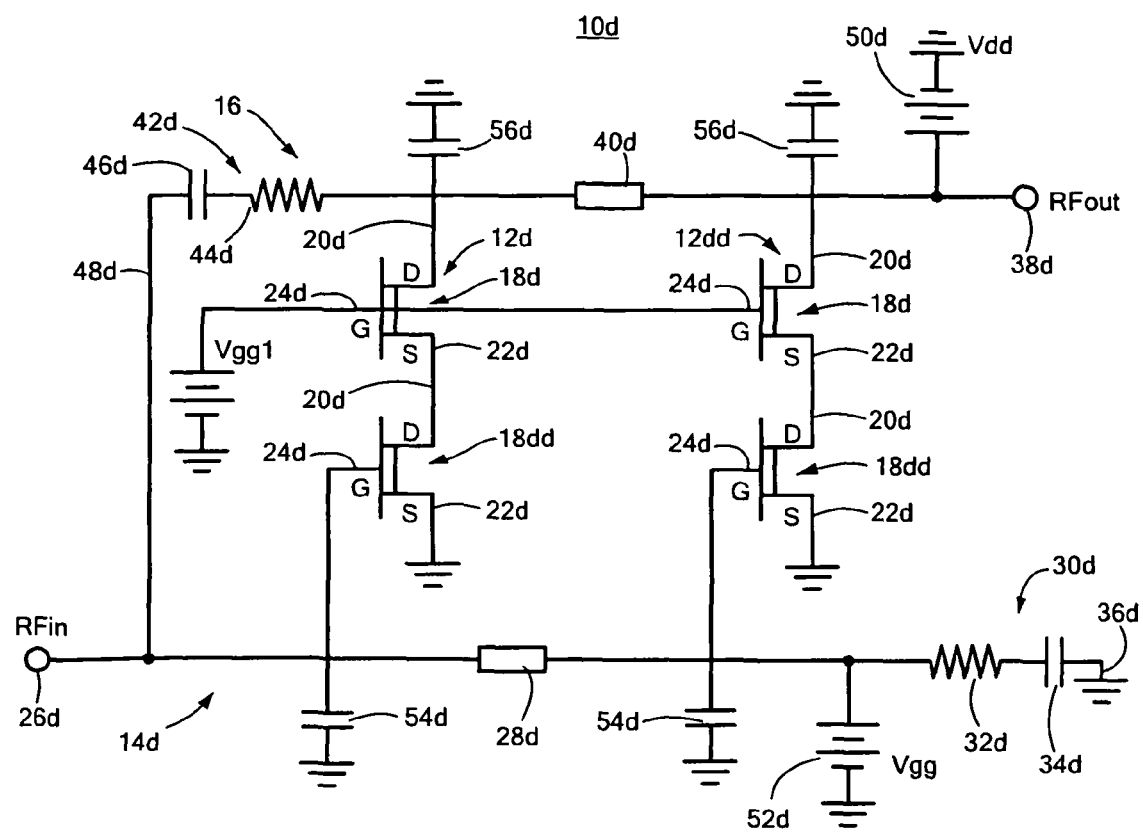
FIG. 5 is a schematic diagram of a distributed amplifier system similar to that of FIG. 4 with the amplifiers being cascode amplifiers.

In addition, the amplifiers need not be simple single transistor amplifiers as shown thus far, but may be, for example, cascode amplifiers 12d, 12dd, FIG. 5, where two FETs 18d and 18dd are used in each amplifier and the additional power supply Vgg1 60 is added, and of course this cascode or other amplifier construction can be applied to the greater than two plurality of slices or amplifier implementations as shown in FIGS. 2, 3 and 4.

Figure 6:
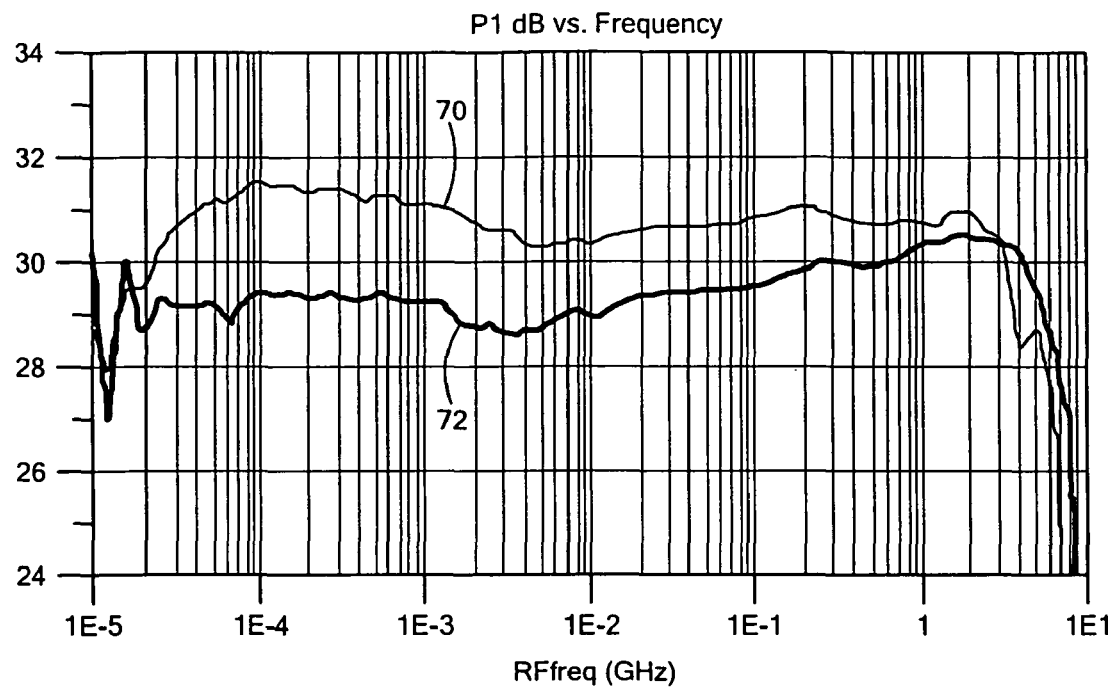
FIG. 6 is an illustration of the power output compression by 1 dB relative to a linear input increase input power (P1dB) characteristics for a prior art distributed amplifier system and a distributed amplifier system according to this invention.
Figure 7:
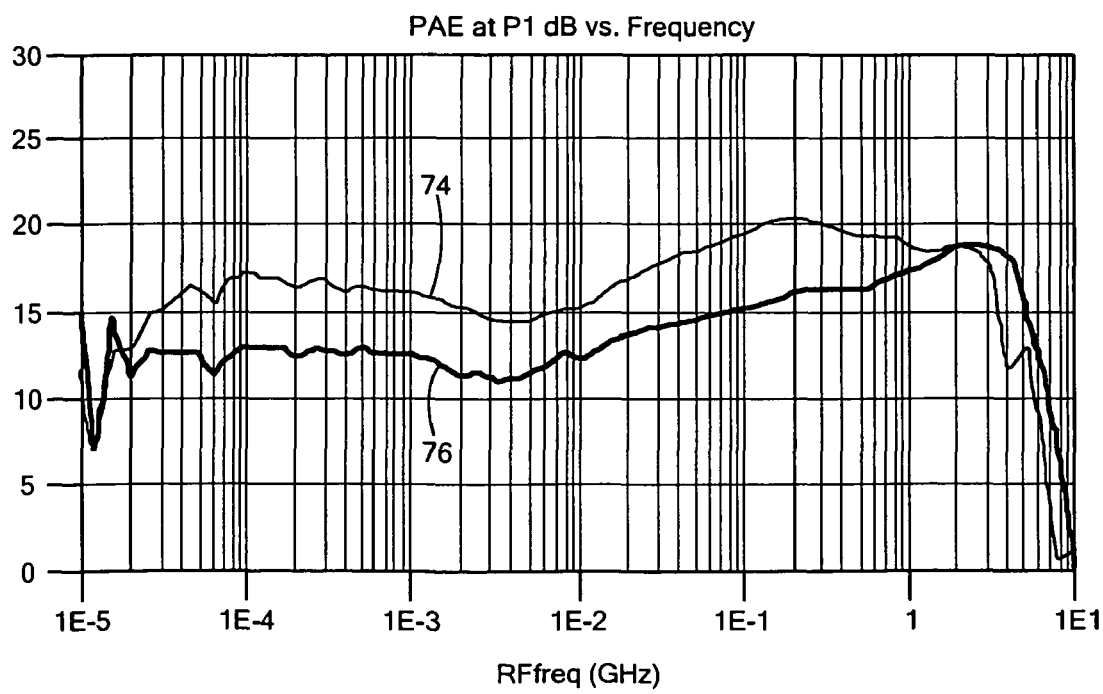
FIG. 7 is an illustration of the power added efficiency (PAE) characteristics for a prior art distributed amplifier system and a distributed amplifier system according to this invention.
Figure 8:
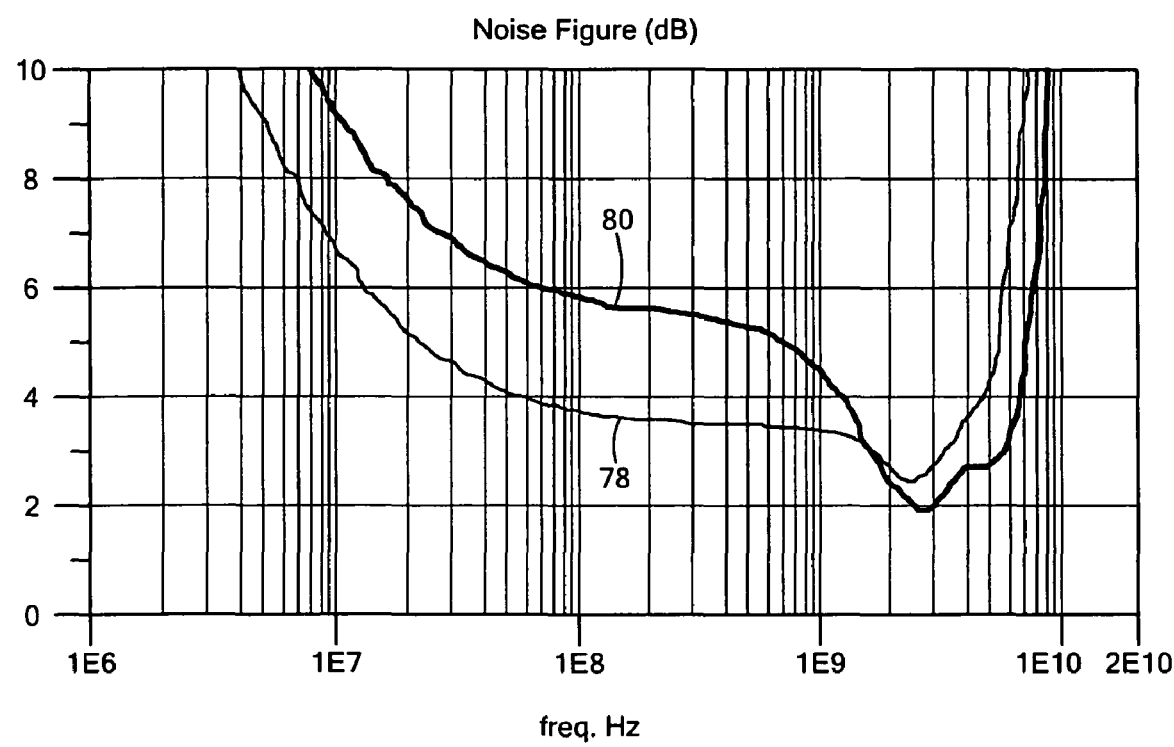
FIG. 8 is an illustration of the noise figure for a prior art distributed amplifier system and a distributed amplifier system according to this invention.

The noise figure of a distributed amplifier is mainly contributed to by the gate or input termination resistor and the transistors. At low frequencies, the thermal noise of the gate or input termination resistor dominates over the noise of the transistors. In the GHz frequency range, the gate or input termination resistor is essentially transparent as the input signal is coupled to the transistors input and the noise figure is dominated by the transistor. Ideally, at low frequencies we would like to make the gate termination resistor transparent as well. The problem with removing it is similar to removing the drain or output termination, which is poor return loss and gain flatness. In a classic distributed amplifier, the input match and gain flatness degrades if the gate or input termination resistor is higher than 50 ohms. However, with the addition of feedback in accordance with this invention between the drain line (output transmission circuit) and gate line (input transmission circuit), the input match will be good at low frequencies while increasing the gate termination resistor higher than 100 ohms; this will bring it closer to becoming transparent. This larger gate termination resistance will decrease the overall noise figure at low frequencies. The improved performance provided by this invention may be seen with respect to FIGS. 6, 7, and 8, which compare the performance of prior art distributed amplifier systems and the distributed amplifier system in accordance with this invention. FIG. 6 is a plot of the power output compressed by 1 dB relative to the linear input increase in input power, also known as P1dB. There the improved response of the distributed amplifier system according to this invention with respect to the response 72 of a traditional system can be seen, where throughout the range from approximately 10 kHz to over 1 GHz there is a significant improvement. FIG. 7 shows a similar improvement from approximately 29 to 30 dBs to 31 dBs. With reference to FIG. 7 the power added efficiency (PAE) can also be seen to have a significant improvement over the same frequency range where the power added efficiency at P1dB is shown by curve 74 and is significantly higher from approximately 10 kHz to over 1 GHz than the response 76 of a traditional system. That the noise figure is improved as well can be seen from FIG. 8 over the range of 1 MHz to 2 GHz where the noise figure is considerably lower as indicated at 78 for the distributed amplifier system of this invention compared to the response 80 of a traditional system. In addition, the noise figure will remain roughly constant until you reach the flicker noise corner frequency of the transistor.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A distributed amplifier system having a predetermined output impedance and input impedance comprising:
    an input transmission circuit;
    an output transmission circuit;
    at least two amplifiers connected between said input and output transmission circuits;
    an input termination on the input transmission circuit; and
    a feedback output termination including a high pass filter coupled between the output transmission circuit and the input transmission circuit for reducing low frequency loss while maintaining said predetermined output impedance and input impedance.

2. The distributed amplifier system of claim 1 in which said plurality of amplifiers includes two amplifiers.

3. The distributed amplifier system of claim 1 in which said amplifiers include cascode amplifiers.

4. The distributed amplifier system of claim 1 in which said input termination includes an input resistance and an input capacitance connected in series to ground.

5. The distributed amplifier system of claim 1 in which the high pass filter of said output termination includes an output resistance and an output capacitance connected in series.

6. The distributed amplifier system of claim 5 in which said output resistance is substantially larger than said predetermined output impedance.

7. The distributed amplifier system of claim 6 in which output resistance is at least twice said predetermined output impedance.

8. The distributed amplifier system of claim 7 in which said output resistance is in the range of two to twenty times said predetermined output impedance.

9. The distributed amplifier system of claim 4 in which said input resistance is substantially larger than said predetermined input impedance for reducing the overall noise figure of said amplifier system.

10. The distributed amplifier system of claim 1 in which said feedback output termination is fed back to the input of said input transmission circuit.

11. The distributed amplifier system of claim 1 in which there is more than one feedback output termination connection between said output transmission circuit and said input transmission circuit.

12. The distributed amplifier system of claim 1 in which the feedback output termination coupled between the output transmission circuit and the input transmission circuit includes only passive components.

13. A distributed amplifier system having a predetermined output impedance and input impedance comprising:
an input transmission circuit;
an output transmission circuit;
at least two amplifiers connected between said input and output transmission circuits;
an input termination on the input transmission circuit; and
two or more feedback output terminations on the output transmission circuit connected back to the input transmission circuit for reducing low frequency loss while maintaining said predetermined output impedance and input impedance.

14. The distributed amplifier system of claim 13 in which each output termination includes an output resistance and an output capacitance connected in series.

15. The distributed amplifier system of claim 13 in which the feedback output termination coupled between the output transmission circuit and the input transmission circuit includes only passive components.

* * * * *